United States Patent
Sugiyama et al.

(10) Patent No.: US 10,176,964 B2
(45) Date of Patent: Jan. 8, 2019

(54) FOCUSED ION BEAM APPARATUS

(71) Applicant: HITACHI HIGH-TECH SCIENCE CORPORATION, Minato-ku, Tokyo (JP)

(72) Inventors: Yasuhiko Sugiyama, Tokyo (JP); Hiroshi Oba, Tokyo (JP)

(73) Assignee: HITACHI HIGH-TECH SCIENCE CORPORATION (JP)

(*) Notice: Subject to any disclaimer, the term of this patent is extended or adjusted under 35 U.S.C. 154(b) by 0 days.

(21) Appl. No.: 15/256,967

(22) Filed: Sep. 6, 2016

(65) Prior Publication Data

US 2017/0069456 A1    Mar. 9, 2017

(30) Foreign Application Priority Data

Sep. 8, 2015   (JP) ................. 2015-176553

(51) Int. Cl.
*H01J 37/08*  (2006.01)
*H01J 37/10*  (2006.01)
*H01J 37/18*  (2006.01)

(52) U.S. Cl.
CPC ............. *H01J 37/08* (2013.01); *H01J 37/10* (2013.01); *H01J 37/18* (2013.01); *H01J 2237/0805* (2013.01); *H01J 2237/103* (2013.01)

(58) Field of Classification Search
CPC .. H01J 37/08; H01J 37/10; H01J 37/12; H01J 37/18; H01J 37/28; H01J 2237/0805; H01J 2237/103
See application file for complete search history.

(56) References Cited

U.S. PATENT DOCUMENTS

| | | | | |
|---|---|---|---|---|
| 8,450,699 | B2 * | 5/2013 | Ohshima | H01J 37/065 250/309 |
| 2005/0066899 | A1 * | 3/2005 | Fukuda | C23C 16/047 118/723 FI |
| 2005/0279952 | A1 * | 12/2005 | Ishitani | H01J 37/12 250/492.21 |
| 2008/0277584 | A1 * | 11/2008 | Kim | B82Y 10/00 250/311 |
| 2009/0146074 | A1 * | 6/2009 | Banzhof | H01J 37/04 250/396 R |
| 2010/0187433 | A1 * | 7/2010 | Eastham | B82Y 15/00 250/396 R |
| 2011/0186745 | A1 * | 8/2011 | Kciaga | H01J 27/26 250/396 R |
| 2013/0240720 | A1 * | 9/2013 | Sugiyama | H01J 3/14 250/252.1 |

FOREIGN PATENT DOCUMENTS

| | | |
|---|---|---|
| JP | 20022511976 | 9/2002 |
| JP | 4299074 | 7/2009 |

* cited by examiner

*Primary Examiner* — David E Smith
(74) *Attorney, Agent, or Firm* — Adams & Wilks (57) ABSTRACT

A focused ion beam apparatus includes an ion source that emits an ion beam, an extraction electrode that extracts ions from a tip end of an emitter of the ion source, and a first lens electrode that configures a condenser lens by a potential difference with the extraction electrode, the condenser lens focusing the ions extracted by the extraction electrode, in which a strong lens action is generated between the extraction electrode and the first lens electrode so as to focus all ions extracted from the ion source to pass through a hole of the condenser lens including the first lens electrode.

19 Claims, 7 Drawing Sheets

| ACCELERATING VOLTAGE: EMITTER | VOLTAGE [V] | | | |
|---|---|---|---|---|
| | EXTRACTION ELECTRODE | FIRST LENS ELECTRODE | SECOND LENS ELECTRODE | THIRD LENS ELECTRODE |
| 30000 | 23500 | -20000 | VARIABLE | 0 |
| 20000 | 13500 | -30000 | VARIABLE | 0 |
| 10000 | 3500 | -40000 | VARIABLE | 0 |
| 5000 | -1500 | -45000 | VARIABLE | 0 |
| 1000 | -5500 | -49000 | VARIABLE | 0 |

FOCUSED ION BEAM APPARATUS

CROSS-REFERENCE TO RELATED APPLICATIONS

This application claims priority from Japanese Patent Application No. 2015-176553 filed on Sep. 8, 2015, the entire subject-matter of which is incorporated herein by reference.

TECHNICAL FIELD

The disclosure relates to a focused ion beam apparatus in which a liquid metal ion source is mounted.

BACKGROUND

There is a focused ion beam apparatus which processes a predetermined region of a surface of a sample by irradiating the predetermined region of the sample with a focused ion beam while scanning, or observes the surface of the sample by detecting secondary particles generated by irradiation of the focused ion beam.

A liquid metal ion source of the focused ion beam apparatus includes an emitter of which a tip end portion is formed in a needle shape and a surface thereof is wet with a liquid metal. The liquid metal is supplied from a liquid metal supplying source to the tip end portion of the emitter, and a surface thereof is always wet with the liquid metal by appropriately energizing a member (filament, or the like) holding the emitter using heating power. Ions are emitted by a strong electric field generated in the tip end portion of the emitter and an extraction electrode where a voltage is applied. A predetermined energy is applied to the emitted ions by a condenser lens configured with a lens electrode and a ground electrode, and the ions are formed in a beam shape. Further, in the focused ion beam apparatus, conditions of the optical system are adjusted, a beam diameter and an ion current value of the focused ion beam are changed, and thus a desired value is obtained.

As the types of the ions of the liquid metal ion source, gallium (Ga) is practically used. In order to emit Ga ions stably, the emitter needs to be operated in a range of 1 µA to 5 µA of ion emission current. The ions are emitted radially from the tip end portion of the emitter. A half of radiation angle at this time is in a range of 10° to 20°. In addition, in order to use the condenser lens in the subsequent stage of the liquid metal ion source in a state in which aberration is small, a distance between the ion source and the condenser lens needs to shortened as much as possible. However, outer peripheral components of the ions emitted from the liquid metal ion source do not pass through a hole of the condenser lens, and stay on an electrode surface, which causes a defect. Measures thereof are disclosed in Japanese Patent No. 4299074.

Japanese Patent No. 4299074 discloses that a smaller beam diameter can be realized by reducing aberration of the condenser lens when a distance between the extraction electrode and the lens electrode of the condenser lens is set to 6 mm or less. In addition, in a technology disclosed in Japanese Patent No. 4299074, the extraction electrode and each electrode of the condenser lens are irradiated with the emitted ions, and secondary electrons and sputter particles are generated from the extraction electrode and each electrode of the condenser lens by the irradiation, such that operation of the ion source is unstabilized. In the technology disclosed in Japanese Patent No. 4299074, when a voltage of the lens electrode is set to 5 kV or less, energy of the ions with which the lens electrode is irradiated. Accordingly, in the technology disclosed in Japanese Patent No. 4299074, even when the lens electrode is irradiated with the ion beam having small energy, since the sputtering yield is reduced, the number of the sputter particles in the lens electrode can be reduced. Accordingly, in Japanese Patent No. 4299074, it is disclosed that stability of the focused ion beam apparatus can be improved.

In addition, JP-A-2002-251976 discloses a configuration that each electrode of the condenser lens is not irradiated with the emitted ions, the secondary electrons and the sputter particles are not generated from each electrode of the condenser lens, and thus stabilized operation of the ion source.

In the related-art technology disclosed in Japanese Patent No. 4299074, since a distance between the emitter and the lens electrode is reduced by setting a distance between the extraction electrode and the lens electrode to 6 mm or less, accumulation of a sputtering material to the emitter is increased. Thus, even if performance of the focused ion beam apparatus is improved, there is a tendency that a stabilizing time of the ion source is shortened.

In addition, in the technology disclosed in JP-A-2002-251976, a size of a lens hole needs to be sufficiently increased (substantially 10 mm) so that each electrode of the condenser lens is not irradiated with the emitted ions. As such, the strong lens action is less likely to be obtained, control of a beam trajectory is limited, and thus a parallel beam cannot be made.

SUMMARY

Illustrative aspects of the invention provide a focused ion beam apparatus, which is capable of realizing a smaller beam diameter by reducing aberration of the condenser lens less than that of the related art, and improving stability of the focused ion beam.

According to one illustrative aspect of the invention, there may be provided a focused ion beam apparatus comprising: an ion source that emits an ion beam; an extraction electrode that extracts ions from a tip end of an emitter of the ion source; and a first lens electrode that configures a condenser lens by a potential difference with the extraction electrode, the condenser lens being configured to focus the ions extracted by the extraction electrode, wherein a strong lens action is generated between the extraction electrode and the first lens electrode so as to focus all ions extracted from the ion source to pass through the condenser lens including the first lens electrode.

According to another illustrative aspect of the invention, there may be provided a focused ion beam apparatus comprising: an ion source that emits an ion beam; an extraction electrode that extracts the ion beam from a tip end of an emitter of the ion source; and a condenser lens that focuses the ions extracted by the extraction electrode in a beam shape by a potential difference with the extraction electrode, wherein the extraction electrode comprises a first extraction electrode and a second extraction electrode, wherein the focused ion beam apparatus further comprises a control electrode between the first extraction electrode and the second extraction electrode, wherein a potential of the first extraction electrode and a potential of the second extraction electrode are the same, and wherein the ion beam radiated from the second extraction electrode becomes a parallel beam by adjusting a voltage of the control electrode so that all of the ions emitted from the ion source passes through a hole of the condenser lens without coming into contact with an electrode configuring the condenser lens.

According to still another illustrative aspect of the invention, there may be provided a focused ion beam apparatus comprising: an ion source that emits an ion beam; an extraction electrode that extracts the ion beam from a tip end of an emitter of the ion source; a condenser lens that focuses the ions extracted by the extraction electrode in a beam shape by a potential difference with the extraction electrode, the condenser lens comprising: a first lens electrode facing the extraction electrode; and a second lens electrode provided on a subsequent stage of the first lens electrode with respect to a traveling direction of the ion beam; and a control device configured to control a potential difference between the extraction electrode and the first lens electrode to be in a range of between 23500V and 83500V so as to focus the ion beam into a beam state.

According to the illustrative aspects of the invention, a smaller beam diameter can be realized by reducing aberration of the condenser lens less than that of the related art, and all of the ions emitted from the ion source do not come into contact with the extraction electrode and each electrode configuring the condenser lens, that is, the ions are capable of passing through a lens hole. Therefore, according to the illustrative aspects of the invention, it is possible that sputtering of the extraction electrode and each electrode configuring the condenser lens and generating of the secondary electrons do not occur, and thus the stable operation time of the ion source can be increased. As a result, according to the illustrative aspects of the invention, performance of the focused ion beam apparatus can be improved further than that of the related art.

DETAILED DESCRIPTION

Hereinafter, illustrative embodiments of the invention will be described with reference to drawings.

First, an outline of the invention will be described.

Figure 1A:
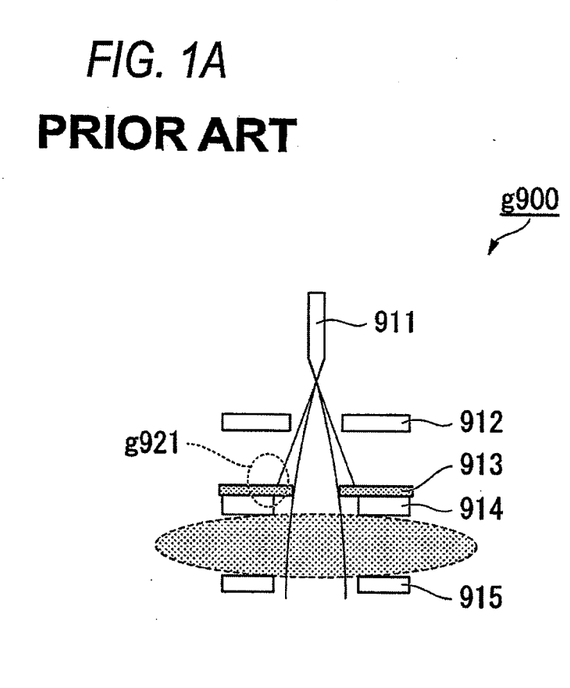
FIG. 1A is a view illustrating an ion source, a condenser lens, and a trajectory of an ion beam of the related art.
Figure 1B:
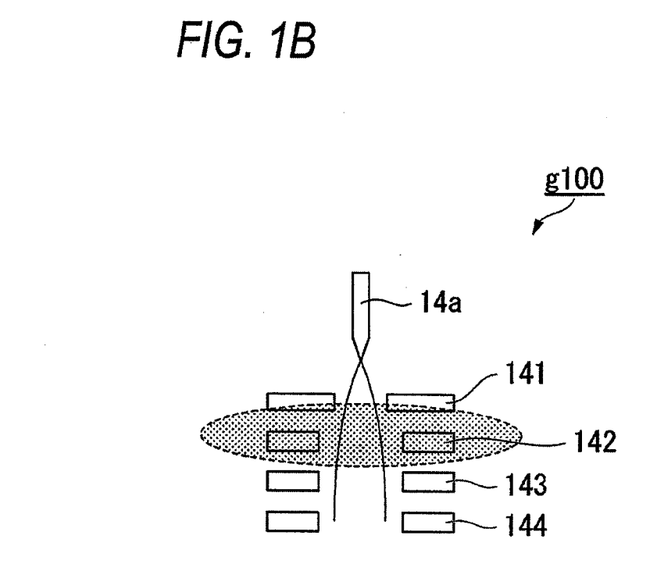
FIG. 1B is a view illustrating an ion source, a condenser lens, and a trajectory of an ion beam of the invention.

FIG. 1A is a view illustrating an ion source, a condenser lens, and a trajectory of an ion beam of the related art, and FIG. 1B is a view illustrating an ion source, a condenser lens, and a trajectory of an ion beam of the invention. Also, the condenser lens is a lens which performs controlling of focusing, accelerating, and decelerating of ions emitted from the ion source.

An image g900 in FIG. 1A is a view illustrating the ion source, the condenser lens, the trajectory of the ion beam of the related art. The image g900 illustrates a part of an ion optical system of the focused ion beam apparatus. The ion source of the related art includes an ion source 911 and an extraction electrode 912. In addition, the condenser lens of the related art includes a fixed diaphragm 913, a first lens electrode 914, and a second lens electrode 915.

The extraction electrode 912 extracts ions from the ion source 911. The fixed diaphragm 913 limits an opening of the ion beam. The first lens electrode 914 and the second lens electrode 915 accelerate and focus the ion beam. As illustrated in a region surrounded by a line of a numeral g921 of the image g900, when the fixed diaphragm 913 is irradiated with the ions, sputter particles and secondary electrons are generated. The generated secondary electrons are attracted to an emitter of the ion source 911, and a part of the sputter particles is accumulated on a surface of the emitter. According to this phenomenon, a stable operation of the ion source is deteriorated.

Therefore, in the invention, as illustrated in the image g100 in FIG. 1B, all of the emitted ions pass through a hole of each electrode configuring the condenser lens by focusing a trajectory of the ions emitted from the ion source 14a, using an extraction electrode 141, a first lens electrode 142, a second lens electrode 143, and a third lens electrode 144.

Accordingly, in the invention, since performance of the focused ion beam (FIB) is improved by reducing aberration, and generation of a sputter and the secondary electrons of the lens electrode can be prevented from being occurred, by a short focal point of the condenser lens of the ion optical system, a stable operation time of the ion source can be increased. In addition, according to the invention, the fixed diaphragm 913 in a configuration of the related art is not necessary.

<Configuration of Focused Ion Beam Apparatus>

Next, a configuration of a focused ion beam apparatus 1 will be described.

Figure 2:
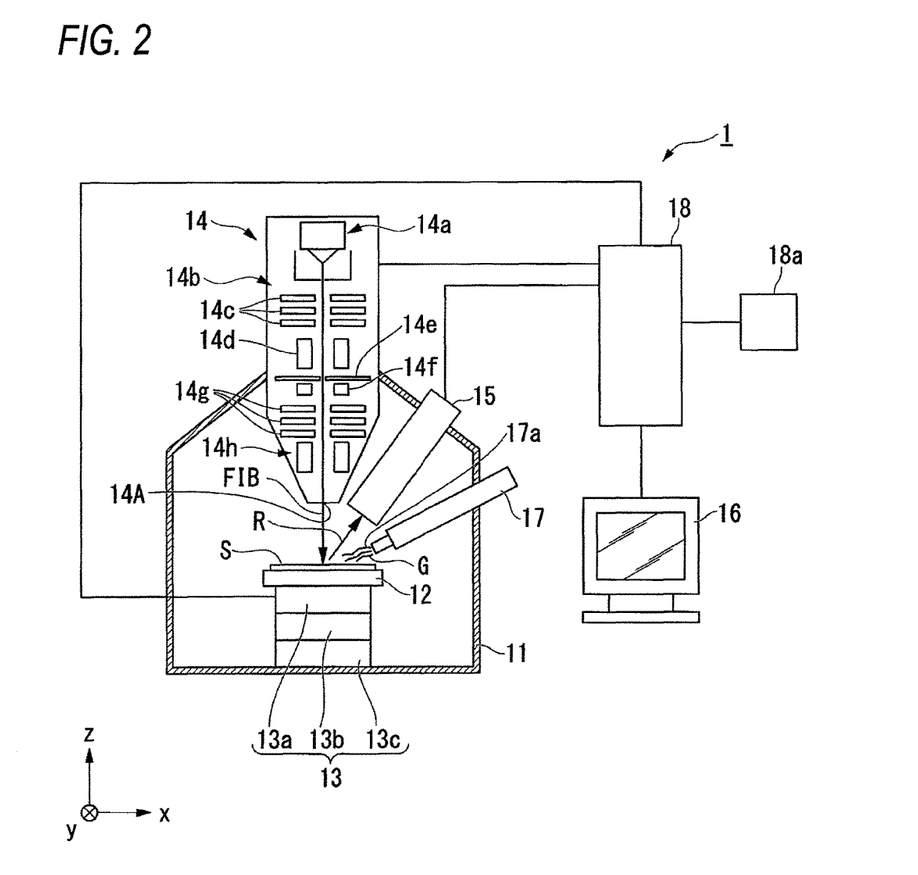
FIG. 2 is a view illustrating a configuration example of a focused ion beam apparatus according to an illustrative embodiment.

FIG. 2 is a view illustrating a configuration example of the focused ion beam apparatus 1 according to the illustrative embodiment. In FIG. 2, a right and left direction of the focused ion beam apparatus 1 is set to an x axis direction, a depth direction is set to a y axis direction, and a height direction is set to a z axis direction.

As illustrated in FIG. 2, the focused ion beam apparatus 1 includes a sample chamber 11 in which an inside can be maintained in a vacuum state, a stage 12 which is capable of fixing the sample S to the inside of the sample chamber 11, and a driving mechanism 13 which drives the stage 12. In addition, the focused ion beam apparatus 1 is configured with the focused ion beam column 14, a detector 15, a display device 16, a gas supply unit 17, and a controller 18.

The driving mechanism 13 is accommodated inside of the sample chamber 11 in a state of being connected to the stage 12, and displaces the stage 12 with respect to a predetermined axis according to a control signal output from the controller 18. The driving mechanism 13 is provided with a moving mechanism 13a which moves the stage 12 in parallel along an x axis and a y axis, which are in parallel or orthogonal to each other on a horizontal plane, and a z axis orthogonal to the x axis and the y axis.

In addition, the driving mechanism 13 is provided with a tilt mechanism 13b which rotates the stage 12 around the x axis or the y axis, and a rotating mechanism 13c which rotates the stage 12 around the z axis.

The focused ion beam column 14 irradiates the sample S fixed to the stage 12 with the focused ion beam. The focused ion beam column 14 allows a beam emitting unit 14A to face the stage 12 from a position of an upper side of a vertical direction of the stage 12 inside of the sample chamber 11, and is fixed to the sample chamber 11 by setting an optical axis to be in parallel to the vertical direction. Accordingly, the sample S fixed to the stage 12 can be irradiated with the focused ion beam in a vertical direction.

In addition, the focused ion beam column 14 is provided with an ion source 14a and an ion optical system 14b. The ion optical system 14b is provided with a condenser lens 14c, a beam blanking electrode 14d, an aperture 14e, an alignment 14f, an objective lens 14g, and a scanning electrode 14h.

The ion source 14a is a liquid metal ion source which uses, for example, liquid gallium. The ion source 14a and the ion optical system 14b allows the controller 18 to control an irradiating position, an irradiating condition of the focused ion beam, and the like.

The condenser lens 14c focuses the ions which are radially emitted from the ion source so as to be a beam state, and as illustrated later, includes the first lens electrode 142, the second lens electrode 143, and the third lens electrode 144, and the like. A size of the lens action can be adjusted by controlling an applied voltage.

The beam blanking electrode 14d controls irradiation to the sample S with the ion beam, which is focused by the condenser lens 14c, according to a control of the controller 18. The beam blanking electrode 14d acts as a deflector. In a case where the sample S is irradiated with the ion beam, the beam blanking electrode 14d is not operated. In a case where irradiation of the ion beam to the sample S is stopped, the ion beam is defected from an optical axis by operating the beam blanking electrode 14d. Accordingly, the ion beam does not pass through a hole of the aperture 14e, a vicinity of the hole is irradiated with the beam, and the beam does not come into contact with an upper side of the sample S.

The aperture 14e controls current of the ion beam according to the control of the controller 18, and may be configured by a plurality of apertures having a different diameter from each other and may be capable of selecting a diameter of the aperture according to a desired beam current.

The alignment 14f corrects the trajectory of the ion beam passed through the aperture 14e according to the control of the controller 18, and adjusts the trajectory so that the ion beam passes through a center portion of the objective lens 14g.

The objective lens 14g focuses the focused ion beam passed though the alignment 14f onto a predetermined position on the sample S according to the control of the controller 18.

The scanning electrode 14h scans the ion beam passed though the objective lens 14g onto the sample S according to the control of the controller 18. The scanning electrode 14h may be disposed on an upper portion of the objective lens 14g.

Although not illustrated, an astigmatism corrector for adjusting a sectional shape of the ion beam to a circle may be provided between the condenser lens 14c and the objective lens 14g.

When the sample S is irradiated with the focused ion beam, the detector 15 detects an intensity (amount of secondary charged particles) of secondary charged particles (for example, secondary electrons, secondary ions, and the like) R emitted from the sample S, and outputs information of the intensity of the detected secondary charged particles R. The detector 15 is disposed on a position, where the intensity of the secondary charged particles R can be detected inside of the sample chamber 11, for example, an upper position of the sample S in an inclined direction, and is fixed to the sample chamber 11.

The display device 16 displays image data and the like based on the secondary charged particles R detected by the detector 15.

The gas supply unit 17 allows a gas unit 17a to face the stage 12 inside of the sample chamber 11, and is fixed to the sample chamber 11. The gas supply unit 17 is capable of supplying gas G for etching for selectively prompting an etching of by the focused ion beam according to a material of the sample S, gas G for deposition for forming a deposition film using a deposition material such as a metal, an insulating member, or the like on a surface of the sample S, or the like to the sample S. For example, when gas G for etching such as a xenon fluoride with respect to a Si based sample S or vapor with respect to an organic based sample S is supplied to the sample S with irradiation of the focused ion beam, the etching is selectively prompted. In addition, when the gas G for deposition of compound gas including, for example phenanthrenene, platinum, carbon, or tungsten is supplied to the sample S with irradiation of the focused ion beam, a solid component dissolved from the gas G for deposition is accumulated on a surface of the sample S.

The controller 18 is disposed outside the sample chamber 11, and is provided with an input unit 18a outputting a signal in accordance with an input operation of an operator.

The controller 18 integrally controls an operation of the focused ion beam apparatus 1 by a signal output from the input unit 18a, a signal generated by an automatic operation control process which is set in advance, or the like.

In addition, even in a case where a potential applied to the emitter (hereinafter, refer to as emitter 14a) of the ion source 14a is changed, the controller 18 controls a potential difference between the emitter 14a and the extraction electrode 141 and/or a potential difference between the emitter 14a and the first lens electrode 142 to be constant.

In an example illustrated in FIG. 2, an apparatus in which irradiation of the focused ion beam is toward the vertical direction is illustrated, but the invention is not limited to this, and may have a configuration in which irradiation of the focused ion beam is from an inclined direction or a horizontal direction.

First Illustrative Embodiment

Figure 3:
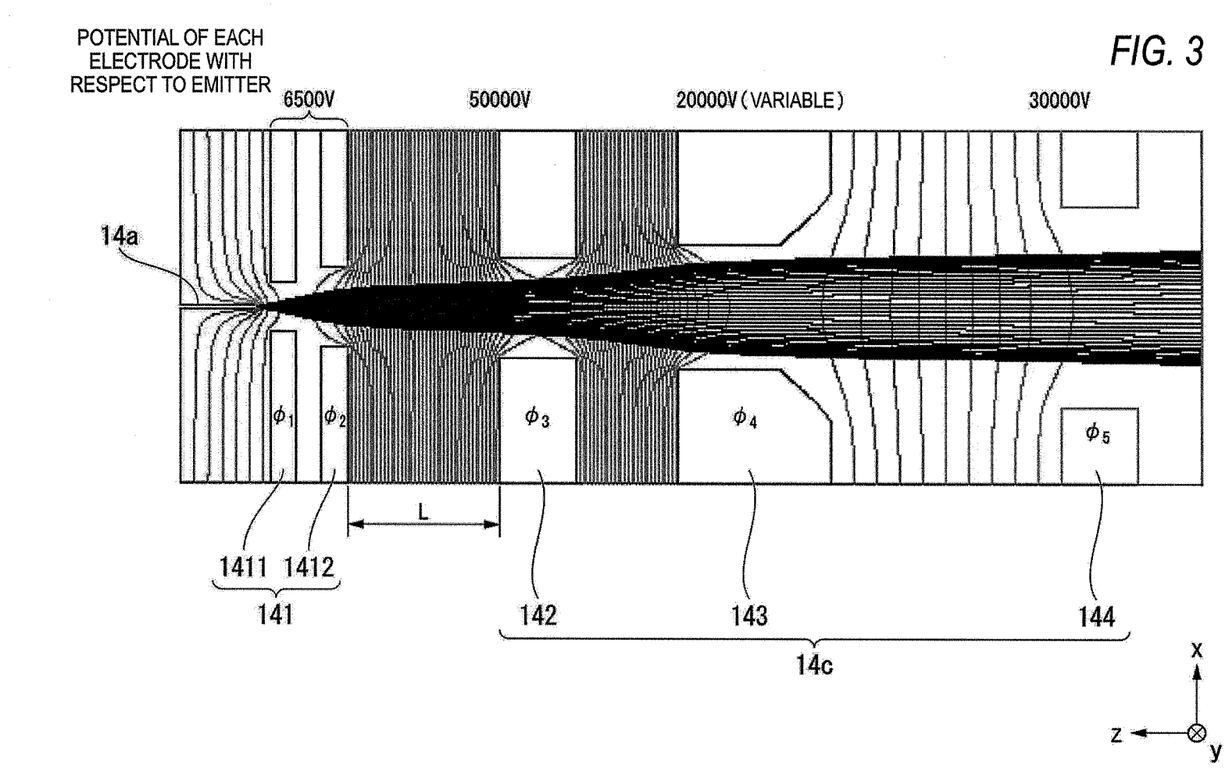
FIG. 3 is a view illustrating a configuration example of a condenser lens according to a first illustrative embodiment, and an example of a potential of each electrode with respect to an emitter.

FIG. 3 is a view illustrating a configuration example of the condenser lens 14c according to the illustrative embodiment, and an example of a potential of each electrode with respect to the emitter 14a. Also, a coordinate system is the same as that of FIG. 2.

As illustrated in FIG. 3, the condenser lens 14c of the illustrative embodiment is provided with the first lens electrode 142, the second lens electrode 143, and the third lens electrode 144. In addition, the extraction electrode 141 is provided with a first extraction electrode 1411 and a second extraction electrode 1412.

First, a diameter of a hole in the x axis and the y axis direction of each electrode will be described. The hole is a circle, and diameters of the hole of the x axis and the y axis are the same as each other.

A hole diameter $\phi_1$ of the first extraction electrode 1411 is, for example, substantially 1 [mm] to 3 [mm]. A hole diameter $\phi_2$ of the second extraction electrode 1412 is, for example, substantially 2 [mm] to 4 [mm]. A hole diameter $\phi_3$ of the first lens electrode 142 is, for example, substantially 3 [mm] to 5 [mm]. A hole diameter $\phi_4$ of the second lens electrode 143 is, for example, substantially 3 [mm] to 5 [mm]. A hole diameter $\phi_5$ of the third lens electrode 144 is, for example, substantially 8 [mm] to 10 [mm]. Also, the hole diameter $\phi_1$ of the first extraction electrode 1411 is smaller than the hole diameter $\phi_2$ of the second extraction electrode 1412. The hole diameter $\phi_2$ of the second extraction electrode 1412 is smaller than the hole diameter $\phi_3$ of the first lens electrode 142. The hole diameter $\phi_3$ of the first lens electrode 142 is equal to the hole diameter $\phi_4$ of the second lens electrode 143. The hole diameter $\phi_4$ of the second lens electrode 143 is smaller than the hole diameter $\phi_5$ of the third lens electrode 144.

Next, the potential of each electrode with respect to the emitter 14a will be described.

FIG. 3 illustrates a potential with respect to positive ions in a case where the applied voltage (accelerating voltage) to the emitter 14a is set to 30000 [V]. The first extraction electrode 1411 and the second extraction electrode 1412 has the same potential, and the potential is, for example, 6500 [V]. A potential of the first lens electrode 142 is, for example, 50000 [V]. A potential of the second lens electrode 143 is, for example, 20000 [V]. A potential of the third lens electrode 144 is 30000 [V]. Also, the third lens electrode 144 is grounded. The potentials of all of the electrodes are adjusted when an operator of the focused ion beam apparatus 1 operates the controller 18 (FIG. 2).

As illustrated in FIG. 3, in the illustrative embodiment, a potential difference between the extraction electrode 141 and the first lens electrode 142 is 43500 [V] (=50000-6500). Accordingly, in the illustrative embodiment, when a strong lens action is generated and the ion beam is focused between the extraction electrode 141 and the first lens electrode 142, all ions emitted from the ion source 14a pass through the condenser lens 14c.

In addition, in order to prevent discharging, a gap L between the second extraction electrode 1412 and the first lens electrode 142 is set to be greater than 6 [mm].

Also, in an example illustrated in FIG. 3, the extraction electrode 141 which is provided with the first extraction electrode 1411 and the second extraction electrode 1412 is described, but the extraction electrode 141 may be one.

<Voltage Applied to Each Electrode, and Example of Potential of First Lens Electrode 142 with Respect to Emitter>

Next, a voltage applied to each electrode, and an example of a potential of the first lens electrode 142 with respect to the emitter will be described.

Figure 4:
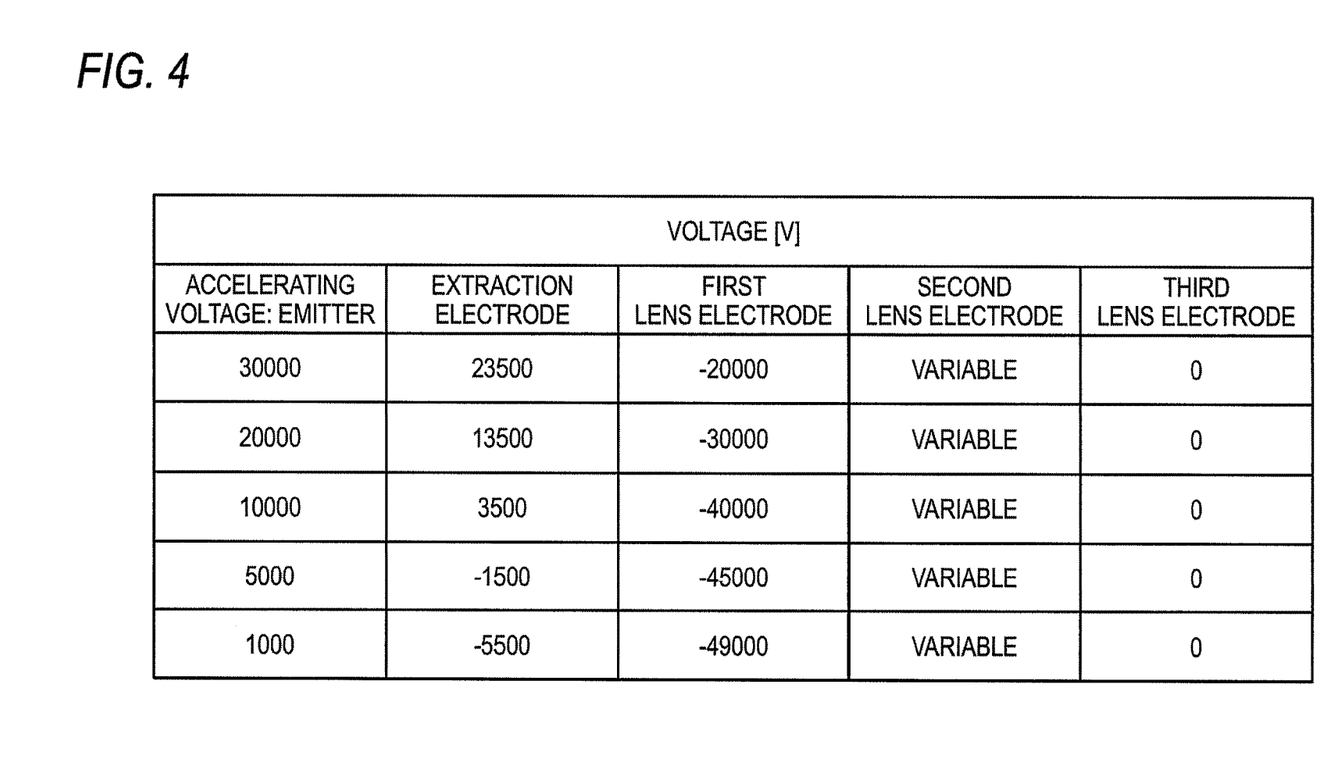
FIG. 4 is a view illustrating a voltage which is applied to each electrode according to the first illustrative embodiment.

FIG. 4 is a view illustrating a voltage applied to each electrode according to the illustrative embodiment. Also, an accelerating voltage applied to the emitter of the ion source 14a is selected by, for example, an operator of the focused ion beam apparatus 1.

As illustrated in FIG. 4, in a case where the accelerating voltage applied to the emitter is 30000 [V], by the control of the controller 18 (FIG. 2), 23500 [V] (=30000-6500) is applied to the extraction electrode 141 with respect to a ground potential, and −20000 [V] (=30000-50000) is applied to the first lens electrode 142 with respect to the ground potential.

In addition, in a case where the accelerating voltage applied to the emitter is 20000 [V], by the control of the controller 18, 13500 [V] (=20000-6500) is applied to the extraction electrode 141 with respect to the ground potential, and −30000 [V] (=20000-50000) is applied to the first lens electrode 142 with respect to the ground potential.

In addition, in a case where the accelerating voltage applied to the emitter is 1000 [V], by the control of the controller 18, −5500 [V] (=1000-6500) is applied to the extraction electrode 141 with respect to the ground potential, and −49000 [V] (=1000-50000) is applied to the first lens electrode 142 with respect to the ground potential.

An example illustrated in FIG. 4 is an example in which the controller 18 controls the potential difference between the accelerating voltage of the emitter and the first lens electrode 142 to become a constant value of 50000 [V]. Incidentally, a range of the constant value may be, for example, between 30000 [V] and 90000 [V].

As illustrated in FIG. 4, even when the accelerating voltage of the emitter is changed, a trajectory of the ions extracted by the extraction electrode 141 is focused by maintaining the potential difference between the accelerating voltage of the emitter and the first lens electrode 142 to be a constant value greater than a voltage difference of the related art, and thus all of the extracted ions is capable of passing though the holes of the first lens electrode 142 to the third lens electrode 144. Accordingly, even when the accelerating voltage of the emitter is changed, it is possible that the ions emitted from the ion source 14a do not come into contact with the condenser lens 14c.

As illustrated in FIG. 4, the controller 18 controls the potential difference between the extraction electrode 141 and the first lens electrode 142 to become a constant value of 43500 [V]. Incidentally, a range of such a constant value may be, for example, between 23500 [V] and 83500 [V].

As seen from the above, the focused ion beam apparatus 1 of the illustrative embodiment includes the ion source 14a emitting the ion beam, the extraction electrode 141 extracting the ions from a tip end of the emitter of the ion source, and the first lens electrode 142 configuring the condenser lens, which focuses the ions extracted from the extraction electrode by the potential difference with the extraction electrode, and a strong lens action is generated between the extraction electrode and the first lens electrode so as to focus all ions extracted from the ion source, thereby causing the ions to pass through the condenser lens including the first lens electrode.

With such a configuration, according to the illustrative embodiment, it is possible that the ions emitted from the ion source 14a are focused by generating the strong lens action between the extraction electrode and the first lens electrode such that the ions do not come into contact with the lens electrode (first lens electrode 142 to third lens electrode 144) which is the condenser lens. Accordingly, according to the illustrative embodiment, it is possible to prevent sputtering of the first lens electrode 142 and generating of the secondary electrons, and the stable operation time of the ion source 14a can be increased. As a result, according to the illustrative embodiment, performance of the focused ion beam apparatus can be improved further than the related art.

In addition, in the focused ion beam apparatus 1 of the illustrative embodiment, even when the accelerating voltage being applied to the emitter (ion source 14a) is changed, a control is performed such that the potential difference between the emitter and the extraction electrode 141 is maintained to be a predetermined value, and the potential difference between the emitter and the first lens electrode 142 is controlled to be a constant voltage difference.

In this configuration, even when the accelerating voltage of the emitter is changed, a potential difference between the accelerating voltage of the emitter and the first lens electrode 142 is maintained to be a constant large value.

In addition, in the focused ion beam apparatus 1 of the illustrative embodiment, the potential difference between the emitter (ion source 14a) and the first lens electrode 142 is 30000 V or more and 90000 V or less.

With the configuration, according to the illustrative embodiment, the condenser lens 14c can have a single focal point. As a result, aberration of the condenser lens 14c can be reduced, and thus performance of the focused ion beam can be improved.

Figure 5:
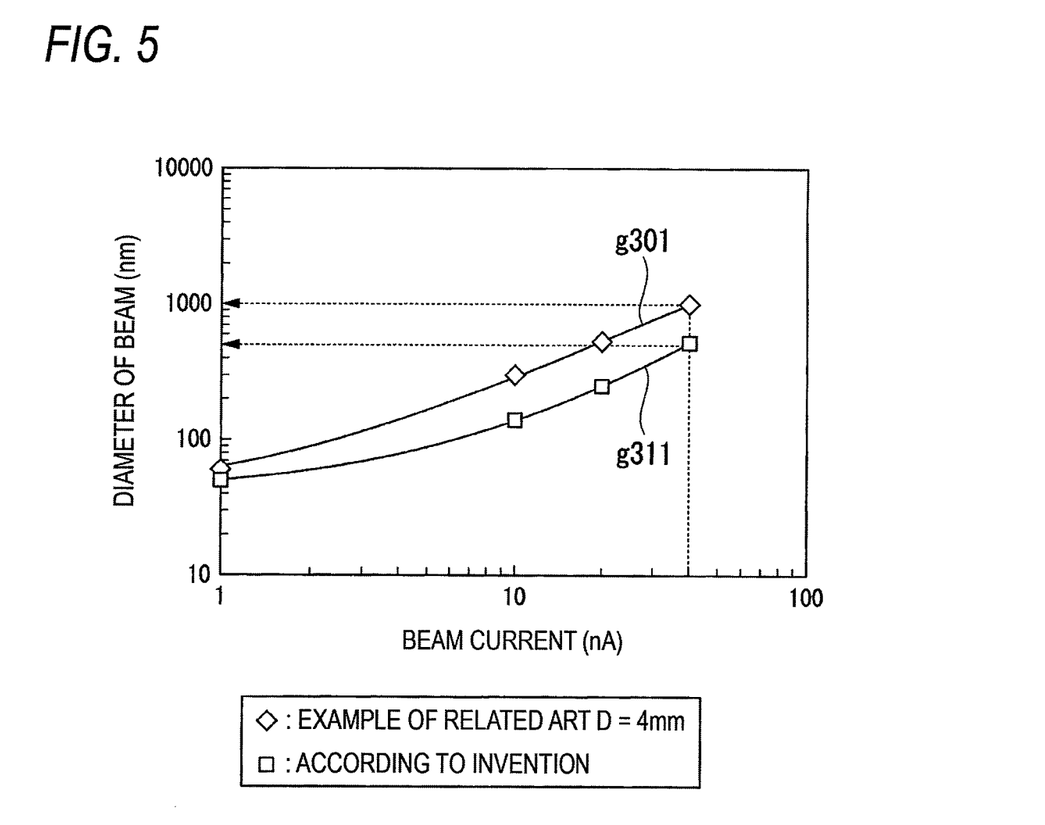
FIG. 5 is a view describing a relationship between beam current and a beam diameter which indicate performance of a focused ion beam in the illustrative embodiment and the related art.

Here, an example of performance of the focused ion beam will be described with reference to FIG. 5. FIG. 5 is a view describing a relationship between a beam current and a beam diameter indicating performance of the focused ion beam in the illustrative embodiment and the related art. In FIG. 5, a horizontal axis is a beam current, and a vertical axis is a beam diameter. A curve line g301 indicates a relationship between a beam current and a beam diameter in the related art, and a curve line g311 indicates a relationship between a beam current and a beam diameter in the illustrative embodiment. In addition, the curve line g301 is an example in which a distance D between the extraction electrode and the lens electrode of the condenser lens is 4 mm. In a case where the beam current is set to be great, it is necessary that a diameter of the aperture 14e becomes great and the ion beam passing through the hole is increased, but blurring is increased by the aberration at the same time, and consequently, the beam diameter becomes widen. If the aberration is suppressed so that the smaller beam diameter can be realized, the performance becomes improved. For example, regarding performance of the focused ion beam illustrated in Japanese Patent No. 4299074, the beam diameter is 1000 nm (1 µm) in a case of a beam current being 40 nA, but according to the invention, the beam diameter is 500 nm in a case of the beam current being 40 nA and can be reduced to ½ than that of the related art.

In addition, according to the illustrative embodiment, since the potential difference between the extraction electrode 141 and the first lens electrode 142 is greater than that of the related art, all beam currents emitted from the ion source 14a are capable of passing through the condenser lens 14c by generating the strong lens action between the extraction electrode 141 and the first lens electrode 142. As a result, according to the illustrative embodiment, it is possible that the ions emitted from the ion source 14a do not come into contact with the lens electrode (first lens electrode 142 to third lens electrode 144). Accordingly, since sputtering of the first lens electrode 142 to the third lens electrode 144 and generating of the secondary electrons can be prevented, the stable operation time of the ion source 14a can be increased. As a result, according to the illustrative embodiment, performance of the focused ion beam apparatus can be improved further than the related art.

In addition, in the focused ion beam apparatus 1 of the illustrative embodiment, the second lens electrode 143 and the third lens electrode 144 are further included in a subsequent stage of the first lens electrode 142 with respect to the traveling direction of the ion beam, the third lens electrode is grounded, and the second lens electrode adjusts the trajectory of the ion beam focused by the first lens electrode according to the potential difference between the first lens electrode and the third lens electrode.

In addition, in the focused ion beam apparatus 1 of the illustrative embodiment, a size of the hole $\phi_3$ of the first lens electrode 142 is equal to a size of the hole $\phi_4$ of the second lens electrode 143, and the size of the hole $\phi_4$ of the second lens electrode 143 is smaller than a size of the hole $\phi_5$ of the third lens electrode 144.

With the configuration, according to the illustrative embodiment, a current amount reaching the sample can be changed by adjusting the trajectory of the ion beam focused by the first lens electrode.

Second Illustrative Embodiment

In the embodiment, an example in which the control electrode 145 is further included in between the first extraction electrode 1411 and the second extraction electrode 1412 will be described.

Figure 6:
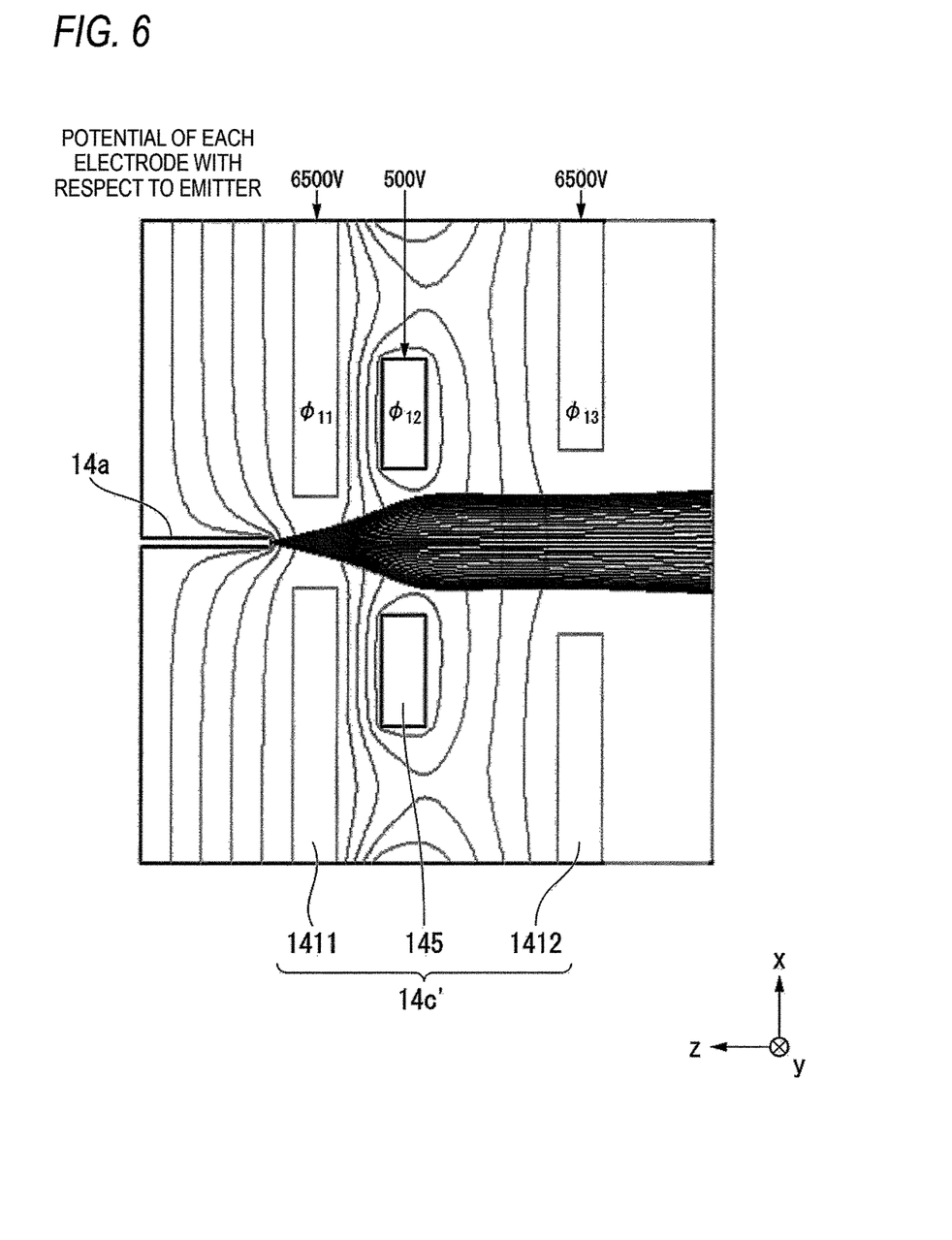
FIG. 6 is a view illustrating a configuration example of an extraction electrode and an example of a potential of each electrode with respect to an emitter according to a second illustrative embodiment.

FIG. 6 is a view illustrating a configuration example of the extraction electrode according to the embodiment, and an example of the potential of each electrode with respect to the emitter. The coordinate system is same as those of FIG. 2 and FIG. 3. Also, the first lens electrode 142, the second lens electrode 143, and the third lens electrode 144 are included in a subsequent stage of the second extraction electrode 1412 in the traveling direction of the ion beam, in a same manner as that of FIG. 3. As illustrated in FIG. 5, an extraction electrode 14c' of the embodiment includes the first extraction electrode 1411, the second extraction electrode 1412, and the control electrode 145. In addition, the control electrode 145 is disposed between the first extraction electrode 1411 and the second extraction electrode 1412. Also, as illustrated in FIG. 5, it is preferable that the control electrode 145 is disposed on a position nearer the first extraction electrode 1411 than the second extraction electrode 1412. Accordingly, the ions emitted from the ion source 14a can be focused on a position near the tip end of the emitter of the ion source 14a.

First, a hole diameter of an x axis direction and a y axis direction of each electrode will be described. The hole is a circle, the hole diameters of the x axis direction and the y axis direction are the same as each other.

A hole diameter $\phi_{11}$ of the first extraction electrode 1411 is, for example, substantially 1 [mm] to 3 [mm]. A hole diameter $\phi_{12}$ of the control electrode 145 is, for example, substantially 2.2 [mm] to 4.2 [mm]. A hole diameter $\phi_{13}$ of the second extraction electrode 1412 is substantially 3 [mm] to 5 [mm]. Also, the hole diameter $\phi_{12}$ of the first extraction electrode 1411 is smaller than the hole diameter $\phi_{12}$ of the control electrode 145. The hole diameter $\phi_{12}$ of the control electrode 145 is smaller than the hole diameter $\phi_{13}$ of the second extraction electrode 1412.

Next, a potential in each electrode with respect to the emitter will be described. FIG. 6 illustrates a potential with respect to positive ions in a case where the applied voltage (accelerating voltage) to the emitter 14a is set to 30000 [V].

The potential Vext of the first extraction electrode 1411 and the second extraction electrode 1412 with respect to the emitter is the same, and is, for example, 6500 [V]. The potential Vcon of the control electrode 145 with respect to the emitter is, for example, 500 [V].

In the embodiment, a ratio Vcon/Vext of the potential Vext and the potential Vcon is set to, for example, 0.01 to 0.5. The ratio Vcon/Vext of the example illustrated in FIG. 5 is substantially 0.077 (=500/6500). In a case of such a configuration, a diameter of the ion beam emitted from the second extraction electrode 1412 can be set to be substantially 1 [mm] to 3 [mm] as a parallel beam. Accordingly, in the embodiment, it is easily configured such that the ion beam does not come into contact with the condenser lens 14*c* disposed on a subsequent stage of the second extraction electrode 1412.

Here, an example of the ion beam trajectory in a case where the potentials Vext of the first extraction electrode 1411 and the second extraction electrode 1412 are changed while constantly maintaining the ratio Vcon/Vext will be described.

Figure 7:
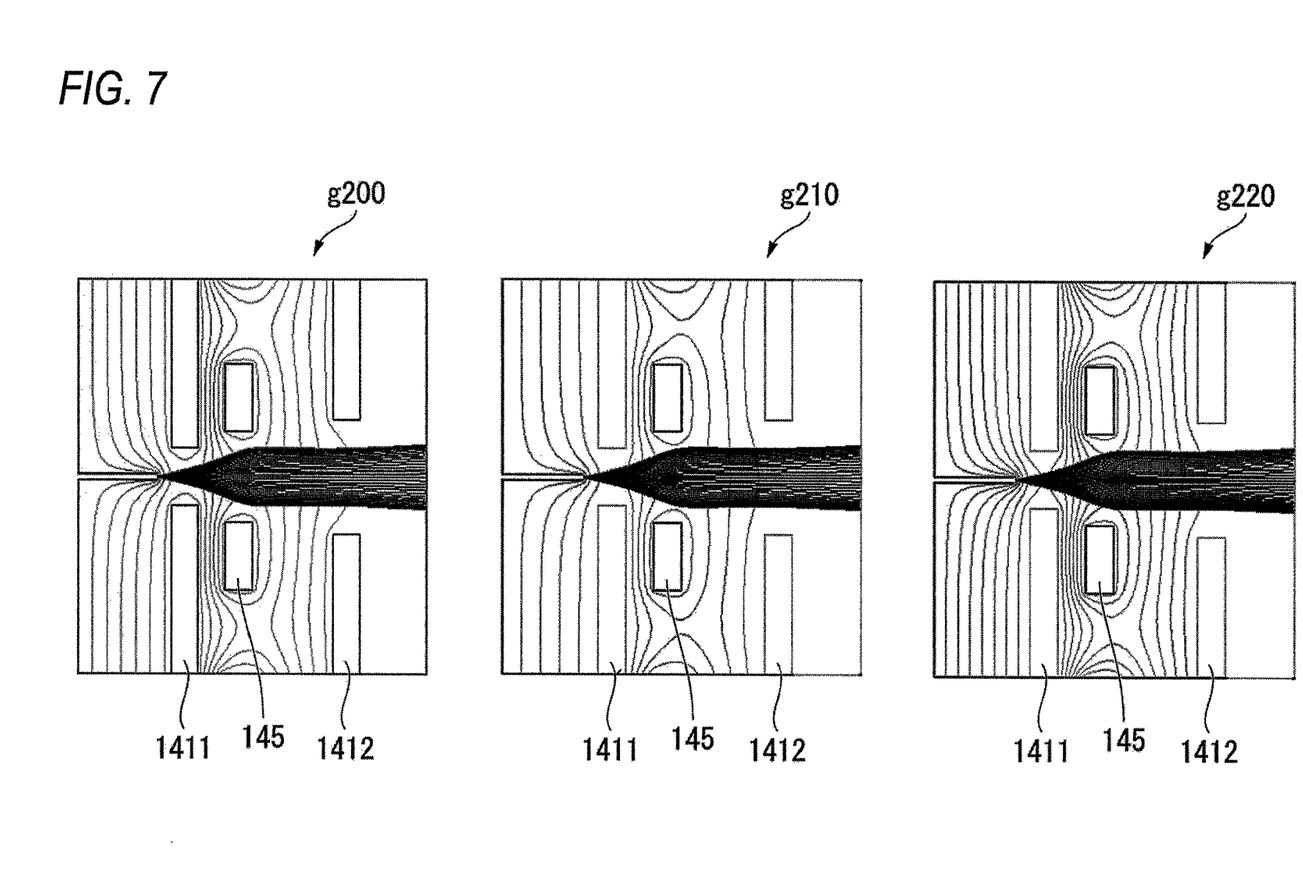
FIG. 7 is a view illustrating an example of an ion beam trajectory in a case where potentials of a first extraction electrode and a second extraction electrode are changed while a ratio Vcon/Vext according to the illustrative embodiment is constantly maintained.

FIG. 7 is a view illustrating an example of the ion beam trajectory in a case where the potentials Vext of the first extraction electrode 1411 and the second extraction electrode 1412 are changed while the ratio Vcon/Vext is constantly maintained according to the embodiment.

In FIG. 7, the ratio Vcon/Vext is 0.077. The image g200 is an image indicating the trajectory of the ion beam when the potential Vext is 6500 [V], and the potential Vcon is 500 [V]. An image g210 is an image indicating the trajectory of the ion beam when the potential Vext is 5000 [V], and the potential Vcon is 385 [V]. The image g220 is an image indicating the trajectory of the ion beam when the potential Vext is 8000 [V], and the potential Vcon is 615 [V].

As illustrated in the image g200 to the image g220 of FIG. 7, even when the potential Vext is changed while the ratio Vcon/Vext is maintained to be a constant value of 0.077, the trajectory of the ion beam is constant. Accordingly, according to the embodiment, since when the ratio Vcon/Vext is maintained to be a constant value, the ion beam is not spread, all of the ion beams can pass though the condenser lens 14*c* in a subsequent stage of the second extraction electrode 1412.

As seen from the above, in the focused ion beam apparatus 1 of the embodiment, the potential of the first extraction electrode 1411 and the potential of the second extraction electrode 1412 are the same potential, and a ratio Vcon/Vext between the potential difference Vext of the emitter (ion source 14*a*) and the first extraction electrode and the potential difference Vcon of the emitter and the control electrode 145 is in a range of 0.01 to 0.5.

With the configuration, in the embodiment, the ion beam radiated from the second extraction electrode 1412 can be set to a parallel beam of, for example, substantially 1 [mm] to 3 [mm]. Accordingly, according to the embodiment, it can be configured that the ion beam does not come into contact with the condenser lens 14*c* disposed on a subsequent stage of the second extraction electrode 1412. Accordingly, since sputtering of the first lens electrode 142 and generating of the secondary electrons can be prevented, the stable operation time of the ion source 14*a* can be increased. As a result, according to the embodiment, performance of the focused ion beam apparatus can be improved further than that of the related art.

Also, the focused ion beam apparatus 1 of the first embodiment or the second embodiment may be applied for any inspection apparatus and processing device.

In addition, it is configured such that the control electrode 145 is provided between the first extraction electrode 1411 and the second extraction electrode 1412 described in the second embodiment, and other components may be components used in an optical system including the condenser lens given in the related art.

In addition, according to the first embodiment or the second embodiment, without increasing the hole diameter of the condenser lens 14*c* (for example, 10 [mm]), it is possible that the ion beam does not come into contact with the condenser lens 14*c*.

Also, these embodiments have been presented by way of an example, and are not intended to limit a range of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A focused ion beam apparatus comprising:
    an ion source that emits an ion beam;
    an extraction electrode that extracts ions from a tip end of an emitter of the ion source, the extraction electrode comprising a first extraction electrode having a first hole diameter and a second extraction electrode having a second hole diameter, the first hole diameter being smaller than the second hole diameter; and
    a first lens electrode that configures a condenser lens by a potential difference with the extraction electrode, the condenser lens facing the extraction electrode and being configured to focus the ions extracted by the extraction electrode,
    wherein a strong lens action is generated between the extraction electrode and the first lens electrode so as to focus all ions extracted from the ion source to pass through the condenser lens including the first lens electrode.

2. The focused ion beam apparatus according to claim 1, wherein, even when an accelerating voltage applied to the emitter is changed, a potential difference between the emitter and the extraction electrode is maintained to be a predetermined value, and a potential difference between the emitter and the first lens electrode is controlled to become a constant voltage difference.

3. The focused ion beam apparatus according to claim 1, wherein the focused ion beam apparatus further comprises a control electrode between the first extraction electrode and the second extraction electrode, and
    wherein the first hole diameter is smaller than a size of a hole of the control electrode.

4. The focused ion beam apparatus according to claim 3, wherein a potential of the first extraction electrode and a potential of the second extraction electrode are the same, and
    wherein a ratio Vcon/Vext is in a range of 0.01 to 0.5, where Vext is a potential difference between the emitter and the first extraction electrode, and Vcon is a potential difference between the emitter and the control electrode.

5. The focused ion beam apparatus according to claim 1, wherein a potential difference between the emitter and the first lens electrode is 30000 V or more and 90000 V or less.

6. The focused ion beam apparatus according to claim 1, further comprising:
    a second lens electrode and a third lens electrode that are provided on a subsequent stage of the first lens electrode with respect to a traveling direction of the ion beam,
    wherein the third lens electrode is grounded, and
    wherein the second lens electrode adjusts a trajectory of the ion beam focused by the first lens electrode according to a potential difference between the first lens electrode and the third lens electrode.

7. The focused ion beam apparatus according to claim 1, wherein a potential difference between the extraction electrode and the first lens electrode is 23500V or more and 83500V or less.

8. The focused ion beam apparatus according to claim 1, wherein the extraction electrode is separate from and not a part of the condenser lens.

9. A focused ion beam apparatus comprising:
an ion source that emits an ion beam;
an extraction electrode that extracts the ion beam from a tip end of an emitter of the ion source; and
a condenser lens that focuses the ions extracted by the extraction electrode in a beam shape by a potential difference with the extraction electrode,
wherein the extraction electrode comprises a first extraction electrode and a second extraction electrode,
wherein the focused ion beam apparatus further comprises a control electrode, between the first extraction electrode and the second extraction electrode,
wherein a potential of the first extraction electrode and a potential of the second extraction electrode are the same,
wherein the ion beam radiated from the second extraction electrode becomes a parallel beam by adjusting a voltage of the control electrode so that all of the ions emitted from the ion source passes through a hole of the condenser lens without coming into contact with an electrode configuring the condenser lens, and
wherein a hole diameter of the condenser lens is equal to or more than 1 mm to less than 10 mm.

10. The focused ion beam apparatus according to claim 9, wherein a hole diameter of the first extraction electrode is smaller than a hole diameter of the control electrode, and
wherein a hole diameter of the control electrode is smaller than the hole diameter of the second extraction electrode.

11. The focused ion beam apparatus according to claim 8, wherein a potential of the first extraction electrode and a potential of the second extraction electrode are the same, and
wherein a ratio Vcon/Vext is in a range of 0.01 to 0.5, where Vext is a potential difference between the emitter and the first extraction electrode, and Vcon is a potential difference between the emitter and the control electrode.

12. A focused ion beam apparatus comprising:
an ion source that emits an ion beam;
an extraction electrode that extracts the ion beam from a tip end of an emitter of the ion source, the extraction electrode comprising a first extraction electrode having a first hole diameter and a second extraction electrode having a second hole diameter, the first hole diameter being smaller than the second hole diameter;
a condenser lens that focuses the ions extracted by the extraction electrode in a beam shape by a potential difference with the extraction electrode, the condenser lens comprising:
a first lens electrode facing the extraction electrode; and
a second lens electrode provided on a subsequent stage of the first lens electrode with respect to a traveling direction of the ion beam; and
a control device configured to control a potential difference between the extraction electrode and the first lens electrode to be in a range of between 23500V and 83500V so as to focus the ion beam into a beam state.

13. The focused ion beam apparatus according to claim 12,
wherein the focused ion beam apparatus further comprises a control electrode between the first extraction electrode and the second extraction electrode, and
wherein the control device is further configured to:
control a potential of the first extraction electrode and a potential of the second extraction electrode to be the same; and
control the ion beam radiated from the second extraction electrode to become a parallel beam by adjusting a voltage of the control electrode so that all of the ions emitted from the ion source passes through a hole of the condenser lens without coming into contact with an electrode configuring the condenser lens.

14. The focused ion beam apparatus according to claim 12, wherein the control device is further configured to control a potential difference between the emitter and the first lens electrode to be in a range of 30000 V or more and 90000 V or less.

15. The focused ion beam apparatus according to claim 9, wherein the emitter is applied with accelerating voltage in a range of from 1000 V to 30000 V.

16. The focused ion beam apparatus according to claim 12, wherein the emitter is applied with accelerating voltage in a range of from 1000 V to 30000 V.

17. The focused ion beam apparatus according to claim 12, wherein the hole diameter of the condenser lens is equal to or more than 1 mm to less than 10 mm.

18. The focused ion beam apparatus according to claim 13,
wherein a hole diameter of the control electrode is smaller than the second hole diameter of the second extraction electrode.

19. The focused ion beam apparatus according to claim 13,
wherein a potential of the first extraction electrode and a potential of the second extraction electrode are the same, and
wherein a ratio Vcon/Vext is in a range of 0.01 to 0.5, where Vext is a potential difference between the emitter and the first extraction electrode, and Vcon is a potential difference between the emitter and the control electrode.

* * * * *